United States Patent
Sasaki et al.

(10) Patent No.: US 11,871,681 B2
(45) Date of Patent: Jan. 9, 2024

(54) MAGNETORESISTANCE EFFECT ELEMENT

(71) Applicant: TDK CORPORATION, Tokyo (JP)

(72) Inventors: Tomoyuki Sasaki, Tokyo (JP); Katsuyuki Nakada, Tokyo (JP); Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 18/080,498

(22) Filed: Dec. 13, 2022

(65) Prior Publication Data

US 2023/0225222 A1 Jul. 13, 2023

Related U.S. Application Data

(62) Division of application No. 17/333,268, filed on May 28, 2021, now Pat. No. 11,600,771, which is a
(Continued)

(30) Foreign Application Priority Data

Mar. 31, 2015 (JP) .................................. 2015-071412

(51) Int. Cl.
  *H01L 29/82* (2006.01)
  *G11C 11/16* (2006.01)
  (Continued)

(52) U.S. Cl.
  CPC ........... *H10N 50/85* (2023.02); *G01R 33/093* (2013.01); *G01R 33/098* (2013.01);
  (Continued)

(58) Field of Classification Search
  CPC ....... H01L 27/105; H01L 29/82; H10N 50/10; H10N 50/85; H10B 61/00; G11C 11/161;
  (Continued)

(56) References Cited

U.S. PATENT DOCUMENTS 8,520,433 B1 8/2013 Kato et al.
9,520,171 B2 12/2016 Inokuchi et al.
(Continued)

FOREIGN PATENT DOCUMENTS

JP 2002-173397 A 6/2002
JP 2012-060087 A 3/2012
(Continued)

OTHER PUBLICATIONS

Masayuki Takagishi; "Magnetoresistance Ratio and Resistance Area Design of CPP-MR Film for 2-5 Tb/in2 Read Sensors;" IEEE Transactions on Magnetics; vol. 46; No. 6; Jun. 2010; pp. 2086-2089.
(Continued)

*Primary Examiner* — David C Spalla
(74) *Attorney, Agent, or Firm* — Oliff PLC

(57) ABSTRACT

A magnetoresistance effect element has a first ferromagnetic metal layer, a second ferromagnetic metal layer, and a tunnel barrier layer that is sandwiched between the first and second ferromagnetic metal layers, and the tunnel barrier layer has a spinel structure represented by a composition formula of $AIn_2O_x$ ($0<x\leq 4$), and an A-site is a non-magnetic divalent cation which is one or more selected from a group consisting of magnesium, zinc and cadmium.

9 Claims, 8 Drawing Sheets

Related U.S. Application Data division of application No. 16/542,462, filed on Aug. 16, 2019, now Pat. No. 11,056,642, which is a division of application No. 16/364,590, filed on Mar. 26, 2019, now Pat. No. 10,446,740, which is a division of application No. 15/556,261, filed as application No. PCT/JP2016/060067 on Mar. 29, 2016, now Pat. No. 10,319,904.

(51) Int. Cl.
| | |
|---|---|
| H01L 27/105 | (2023.01) |
| G01R 33/09 | (2006.01) |
| G11B 5/39 | (2006.01) |
| H10N 50/85 | (2023.01) |
| H10B 61/00 | (2023.01) |
| H10N 50/10 | (2023.01) |

(52) U.S. Cl.
CPC .......... G11B 5/3909 (2013.01); G11C 11/161 (2013.01); G11C 11/1675 (2013.01); H01L 27/105 (2013.01); H01L 29/82 (2013.01); H10B 61/00 (2023.02); H10N 50/10 (2023.02)

(58) Field of Classification Search
CPC .............. G11C 11/1675; G01R 33/093; G01R 33/098; G11B 5/3909
See application file for complete search history.

(56) References Cited

U.S. PATENT DOCUMENTS

| | | | |
|---|---|---|---|
| 10,255,934 B2 | 4/2019 | Sasaki et al. | |
| 2004/0165428 A1 | 8/2004 | Odagawa et al. | |
| 2011/0211272 A1 | 9/2011 | Butler et al. | |
| 2012/0061781 A1 | 3/2012 | Ohmori et al. | |
| 2012/0081950 A1 | 4/2012 | Slaughter | |
| 2012/0091548 A1 | 4/2012 | Sukegawa et al. | |
| 2012/0288963 A1 | 11/2012 | Nishimura | |
| 2013/0221461 A1* | 8/2013 | Sukegawa ............ | H10N 50/10 257/E29.323 |
| 2013/0249026 A1 | 9/2013 | Kitagawa et al. | |
| 2013/0249028 A1 | 9/2013 | Kamata et al. | |
| 2014/0291663 A1 | 10/2014 | Kuo et al. | |
| 2014/0301136 A1 | 10/2014 | Inokuchi et al. | |
| 2015/0061053 A1* | 3/2015 | Nakayama ............ | H10B 61/00 257/421 |
| 2015/0357016 A1 | 12/2015 | Inokuchi et al. | |
| 2016/0148975 A1 | 5/2016 | Kato et al. | |
| 2016/0284982 A1 | 9/2016 | Sasaki et al. | |
| 2016/0380182 A1* | 12/2016 | Watanabe ............ | H10N 50/01 257/427 |
| 2019/0378974 A1 | 12/2019 | Sasaki et al. | |

FOREIGN PATENT DOCUMENTS

| | | |
|---|---|---|
| JP | 2013-175615 A | 9/2013 |
| JP | 2013-197406 A | 9/2013 |
| JP | 5586028 B2 | 9/2014 |
| JP | 2014-203931 A | 10/2014 |
| JP | 2015-061043 A | 3/2015 |
| JP | 2015-090870 A | 5/2015 |
| WO | 2004/059745 A1 | 7/2004 |
| WO | 2013/099740 A1 | 7/2013 |

OTHER PUBLICATIONS

Jun. 21, 2016 International Search Report issued in International Patent Application No. PCT/JP2016/060067.
Jul. 2, 2018 Office Action issued in U.S. Appl. No. 15/556,261.
Jun. 14, 2016 International Search Report issued in International Patent Application No. PCT/JP2016/060034.
May 15, 2018 Office Action issued in U.S. Appl. No. 15/554,066.
Sukegawa et al., "Tunnel magnetoresistance with improved bias voltage dependence in lattice-matched Fe/spinel MgAl2O4/Fe(001) junctions," Applied Physics Letters, 2010, vol. 96, 212505, pp. 1-3.
Scheike et al., "Lattice-matched magnetic tunnel junctions using a Heusler alloy Co2FeAl and a cation-disorder spinel Mg—Al—O barrier," Applied Physics Letters, 2014, vol. 105, 242407, pp. 1-5.
Miura et al., "First-principles study of tunneling magnetoresistance in Fe/MgAl2O4/Fe(001) magnetic tunnel junctions," Physical Review B, 2012, vol. 86, 024426, pp. 1-6.
Sukegawa et al., "Bias voltage dependence in magnetic tunnel junctions with a spinel Mg—Al-O barrier," The 62nd USAP Spring Meeting Koen Yokoshu, Feb. 26, 2015, p. 09-142.
Jun. 14, 2016 International Search Report issued in International Patent Application No. PCT/JP2016/059884.
May 15, 2018 Office Action issued in U.S. Appl. No. 15/554,410.
Apr. 3, 2019 Office Action issued in Chinese Application No. 201680019561.3.
Oct. 11, 2019 Office Action issued in U.S. Appl. No. 16/250,557.
Dec. 11, 2019 Office Action issued in U.S. Appl. No. 16/277,045.
Dec. 13, 2019 Notice of Allowance issued in U.S. Appl. No. 16/250,557.
Feb. 7, 2020 Corrected Notice of Allowability issued in U.S. Appl. No. 16/250,557.
U.S. Appl. No. 16/277,045, filed Feb. 15, 2019 in the name of Sasaki et al.
U.S. Appl. No. 16/819,373, filed Mar. 16, 2020 in the name of Sasaki.
Mar. 25, 2020 Notice Of Allowance Issued in U.S. Appl. No. 16/277,045.
May 29, 2020 Office Action issued in U.S. Appl. No. 16/542,462.
May 29, 2020 Office Action issued in U.S. Appl. No. 16/492,040.
Sukegawa et al, "Post-oxidized Mg—Al—(001) coherent tunneling barrier in a wide range of resistance-area products", Applied Physics Letters 105, 092403 (Sep. 4, 2014).
Sep. 14, 2022 Office Action Issued in U.S. Appl. No. 17/333,268.

\* cited by examiner

MAGNETORESISTANCE EFFECT ELEMENT

This is a Divisional of application Ser. No. 17/333,268, filed May 28, 2021, which is a Divisional of application Ser. No. 16/542,462, filed Aug. 16, 2019, which is a Divisional of application Ser. No. 16/364,590 filed Mar. 26, 2019, which in turn is a Divisional of application Ser. No. 15/556,261 filed Sep. 6, 2017, which in turn is a National Stage Application of PCT/JP2016/060067 filed Mar. 29, 2016, which claims priority to Japanese Patent Application No. 2015-071412, filed on Mar. 31, 2015. The entire disclosure of the prior applications is hereby incorporated by reference herein in its entirety.

TECHNICAL FIELD

The present invention relates to a magnetoresistance effect element.

BACKGROUND ART

Giant magnetoresistance (GMR) elements formed of a multilayer film consisting of a ferromagnetic layer and a non-magnetic layer, and tunnel magnetoresistance (TMR) elements using an insulating layer (a tunnel barrier layer or a barrier layer) as a non-magnetic layer have been known. In general, TMR elements have higher element resistance than GMR elements, but a magnetoresistance (MR) ratio of the TMR elements is higher than that of the GMR elements. The TMR elements can be divided into two types. One type is related to TMR elements using only a tunneling effect using an effect of soaking-out of a wave function between ferromagnetic layers. The other type is related to TMR elements using coherent tunneling using conduction in a specific orbit of a non-magnetic insulating layer where tunneling is carried out when the above-described tunneling effect is caused. TMR elements using coherent tunneling have been known to obtain a higher MR ratio than TMR elements using only tunneling. The coherent tunneling effect is caused in a case where both of the ferromagnetic layer and the non-magnetic insulating layer are crystalline and an interface between the ferromagnetic layer and the non-magnetic insulating layer is crystallographically continuous.

Magnetoresistance effect elements are used for various purposes. For example, magnetoresistance effect-type magnetic sensors have been known as magnetic sensors, and magnetoresistance effect elements determine characteristics of a reproducing function of hard disk drives. Magnetic sensors have a system that detects, as a resistance change of a magnetoresistance effect element, an effect that a magnetization direction of the magnetoresistance effect element is changed by an external magnetic field. According to Non-Patent Document 1, it is known that the highest reproducing performance can be obtained in a case where RA is about 0.1 to 0.2 in a magnetic sensor for detecting a magnetic field of a micro-region, which is represented by a magnetic head, with a consideration of high-frequency response.

Highly anticipated devices are magnetoresistance change-type random access memories (MRAM). MRAMs are memories that read magnetoresistance as digital signals of 0 and 1 by appropriately changing ferromagnetic magnetization directions of two layers to parallel or antiparallel directions.

LITERATURE

Patent Documents

[Patent Document 1] Japanese Patent No. 5586028
[Patent Document 2] Japanese Unexamined Patent Application, First Publication No. 2013-175615
[Non-Patent Document 1] Hiroaki Sukegawa, a [1] Huixin Xiu, Tadakatsu Ohkubo, Takao Furubayashi, Tomohiko Niizeki, Wenhong Wang, Shinya Kasai, Seiji Mitani, Koichiro Inomata, and Kazuhiro Hono, Applied Physics Letters 96, 212505 [1] (2010)
[Non-Patent Document 2] Thomas Scheike, Hiroaki Sukegawa, Takao Furubayashi, Zhenchao Wen, Koichiro Inomata, Tadakatsu Ohkubo, Kazuhiro Hono, and Seiji Mitani, Applied Physics Review, 105,242407 (2014)
[Non-Patent Document 3] Yoshio Miura, Shingo Muramoto, Kazutaka Abe, and Masafumi Shirai, Physical Review B 86, 024426 (2012)
[Non-Patent Document 4] Masayuki Takagishi, Kenichiro Yamada, Hitoshi Iwasaki, Hirimi N. Fuke and Susumu Hashimoto, IEEE Trans Magn., Vol. 46, No. 6, 2086 (2010)

DISCLOSURE OF INVENTION

Problem to be Solved by Invention

Until recent years, MgO had been used as a non-magnetic insulating layer for causing the coherent tunneling. However, there are problems that it is difficult to lower RA down to about 0.1 to 0.2 in a case where the MgO is used as the non-magnetic insulating layer, and a MR ratio is insufficient even though RA decreases.

Future devices such as magnetic sensors and MRAMs are required to obtain a sufficiently high MR ratio even at a high bias voltage. In a magnetic sensor, an electrical signal obtained as a resistance change in a circuit should be amplified in order to observe a minute magnetic field such as geomagnetism or biomagnetism. In order to realize higher sensitivity than conventional sensors, as well as the MR ratio, an output voltage or an output current is also required to be increased, and driving at a high bias voltage is also required. In a case of MRAM, high-voltage driving is required in a write operation. In spin transfer torque-type (STT) MRAMs, the more the magnetization direction of a ferromagnetic layer changes, the higher current density is required to be applied to the magnetoresistance effect element. The magnetization direction of a ferromagnetic layer is an effect of the action of a spin-polarized current on the spin of the ferromagnetic layer. Similarly to the MR ratio, a rewrite current is generated by a strong spin-polarized current, and thus a high MR ratio is similarly required at a high bias voltage in STT-MRAMs.

In Patent Document 1 and Non-Patent Document 1, a tunnel barrier having a spinel structure is reported to be effective as a substituent material for MgO. A spinel tunnel barrier expressed by a composition formula of $MgAl_2O_4$ has been known to obtain the same MgO ratio as MgO, and to obtain a higher MR ratio than MgO at a high bias voltage. In addition, in Patent Document 2 and Non-Patent Documents 2 and 3, there is a description that $MgAl_2O_4$ is required to have a disordered spinel structure in order to obtain a high MR ratio. The above-described disordered spinel structure denotes a structure where oxygen atoms are arranged in cubic close-packed lattice that is substantially similar to spinel lattice, the structure as a whole belongs to a cubic structure, but arrangement of magnesium and aluminum atoms are disordered. In an original ordered spinel, Mg and Al are arranged in order in the tetrahedral vacancies and octahedral vacancies in the original spinel. However, since these are arranged in random arrangement in the disordered spinel structure, the crystal symmetry of the structure is different from $MgAl_2O_4$, and the lattice constant of the structure is substantially half of 0.808 nm of $MgAl_2O_4$.

The invention is contrived in view of the above-described circumstances, and an object thereof is to provide a magnetoresistance effect element that obtains a high MR ratio with lower RA than in a TMR element using MgO or $MgAl_2O_4$, conventional materials of a tunnel barrier layer.

Means for Solving the Problems

In order to solve the above-described problems, a magnetoresistance effect element according to the invention has a first ferromagnetic metal layer, a second ferromagnetic metal layer, and a tunnel barrier layer that is sandwiched between the first and second ferromagnetic metal layers, and the tunnel barrier layer has a spinel structure represented by a composition formula of $AIn_2O_x$ ($0<x\leq 4$), and A is a non-magnetic divalent cation which is one or more selected from a group consisting of magnesium, zinc and cadmium.

Since a spinel material containing trivalent indium (In) and oxygen has a bandgap narrower than that of the conventional tunnel material, it is possible to form a low-resistance tunnel barrier and to express a MR ratio with lower RA than that of the conventional tunnel material.

In the magnetoresistance effect element, the tunnel barrier layer may have a lattice-matched portion that is lattice-matched with both of the first ferromagnetic metal layer and the second ferromagnetic metal layer, and a lattice-mismatched portion that is not lattice-matched with at least one of the first ferromagnetic metal layer and the second ferromagnetic metal layer.

In the magnetoresistance effect element, a volume ratio of the lattice-matched portion in the tunnel barrier layer with respect to a volume of the entire tunnel barrier layer may be 65% to 95%.

In a case where the volume ratio of the lattice-matched portion in the tunnel barrier layer is 65% or less, the effect of coherent tunneling decreases, and thus the MR ratio is reduced. In a case where the volume ratio of the lattice-matched portion in the tunnel barrier layer is 95% or greater, the interference effect between the spin-polarized electrons during passing through the tunnel barrier layer does not decrease, and thus an increase in passage of the spin-polarized electrons through the tunnel barrier layer is not observed. By making the concentration of constituent elements of the non-magnetic element smaller than half the concentration of elements of the aluminum ion, vacancies are generated in the cation sites, the vacancies and two or more types of non-magnetic elements occupy the cations sites, and thus lattice periodicity is disturbed. Accordingly, the MR ratio is further increased.

In the magnetoresistance effect element, the tunnel barrier layer may have a spinel structure in which an atomic arrangement is disordered. The coherent tunneling effect is increased due to an electronic band folding effect by providing the spinel structure in which the atom arrangement is disordered. Accordingly, the MR ratio is increased.

In the magnetoresistance effect element, a difference in ionic radius between divalent cations of a plurality of non-magnetic elements may be 0.2 Å or less. In a case where the difference in ionic radius is small, the cations are unlikely to be ordered, and thus the lattice constant becomes smaller than that of a general spinel structure. Accordingly, the MR ratio is further increased in a case of two or more types of elements that are similar to each other in ionic radius.

In the magnetoresistance effect element, the concentration of constituent elements in a unit cell of the divalent cation may be more than half the concentration of elements in a unit cell of the trivalent cation (In). By making the concentration of constituent elements of the divalent cation smaller than half the concentration of elements of the trivalent cation, vacancies are generated in the cations, the vacancies and two or more types of non-magnetic elements occupy the cations, and thus lattice periodicity is disturbed. Accordingly, the MR ratio is increased.

In the magnetoresistance effect element, the first ferromagnetic metal layer may have larger coercivity than the second ferromagnetic metal layer. Since the coercivity of the first ferromagnetic metal layer is different from that of the second ferromagnetic metal layer, the element functions as a spin valve, which allows for device applications.

In the magnetoresistance effect element, the tunnel barrier layer may have a film thickness of 0.7 nm to 1.7 nm. Accordingly, the high MR ratio can be obtained, and the magnetoresistance effect element is available in devices to which the high bias voltage is applied, e.g. a high-sensitive magnetic sensor, a logic-in-memory and a MRAM.

In the magnetoresistance effect element, at least one of the first ferromagnetic metal layer and the second ferromagnetic metal layer may have magnetic anisotropy perpendicular to a stacking direction. Since it is not necessary to apply a bias magnetic field, it is possible to reduce the device in size. In addition, the element can be allowed to function as a recording element since it has high thermal disturbance resistance.

In the magnetoresistance effect element, at least one of the first ferromagnetic metal layer and the second ferromagnetic metal layer may be $Co_2Mn_{1-a}Fe_aAl_bSi_{1-b}$ ($0\leq a\leq 1$, $0\leq b\leq 1$). $Co_2Mn_{1-a}Fe_aAl_bSi_{1-b}$ is a ferromagnetic metal material having high spin polarizability, and a higher MR ratio can be obtained than in a case where another ferromagnetic metal material is used.

Effects of the Invention

According to the invention, it is possible to provide a magnetoresistance effect element that obtains a high MR ratio with lower RA than TMR elements using MgO or $MgAl_2O_4$, conventional materials of the tunnel barrier layer.

BRIEF DESCRIPTION OF DRAWINGS

FIG. 14(A) shows a high-resolution cross-section TEM image. FIG. 14(B) shows an example of an image obtained by performing inverse Fourier analysis.

FIG. 16(A) is a diagram showing element resistance (Rp) when magnetization directions of the first ferromagnetic metal layer and the second ferromagnetic metal layer are parallel to each other. FIG. 16(B) is a diagram showing element resistance (Rap) when magnetization directions of the first ferromagnetic metal layer and the second ferromagnetic metal layer are antiparallel to each other. FIG. 16(C) is a diagram showing a magnetoresistance ratio of the element.

EMBODIMENTS FOR CARRYING OUT THE INVENTION

Figure 1:
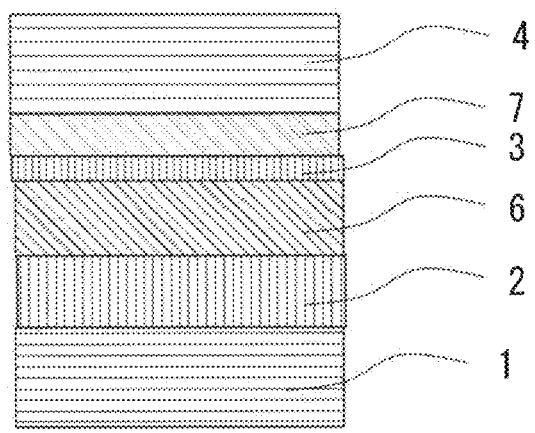
FIG. 1 shows a stacked structure of a magnetoresistance effect element.
Figure 1:

Hereinafter, embodiments of the invention will be described in detail with reference to the accompanying drawings. In the description of the drawings, the same elements will be denoted by the same reference numerals, and an overlapping description thereof will be omitted.

First Embodiment

Hereinafter, a case where a magnetoresistance effect element according to a first embodiment has a first ferromagnetic metal layer 6, a second ferromagnetic metal layer 7, and a tunnel barrier layer 3 sandwiched between the first and second ferromagnetic metal layers, and has a spinel structure represented by a composition formula $AIn_2O_x$ ($0<x\leq4$), and A is a non-magnetic divalent cation which is at least one selected from magnesium, zinc and cadmium.

(Basic Structure)

In the example shown in FIG. 1, a magnetoresistance effect element 100 is provided on a substrate 1, and has a stacked structure provided with an underlayer 2, a first ferromagnetic metal layer 6, a tunnel barrier layer 3, a second ferromagnetic metal layer 7, and a cap layer 4 in order from the substrate 1.

(Tunnel Barrier Layer)

The tunnel barrier layer 3 is made of a non-magnetic insulating material. In general, the tunnel barrier layer has a film thickness of 3 nm or less, and in a case where the tunnel barrier layer is sandwiched between metal materials, a wave function of electrons of atoms of the metal materials extends beyond the tunnel barrier layer 3, and thus a current may flow regardless of the presence of an insulating material on the circuit. The magnetoresistance effect element 100 is classified into two types including: a type in which the typical tunneling effect is used; and a type in which the coherent tunneling effect where an orbit for tunneling is limited is predominant. In the typical tunneling effect, a magnetoresistance effect is obtained by spin polarization of ferromagnetic materials. On the other hand, in the coherent tunneling, an orbit for tunneling is limited. Therefore, in a magnetoresistance effect element in which coherent tunneling is predominant, an effect higher than or equivalent to spin polarization of ferromagnetic metal materials can be expected. In order to exhibit the coherent tunneling effect, it is necessary that the ferromagnetic metal materials and the tunnel barrier layer 3 be crystallized and joined in a specific orientation.

(Spinel Structure)

Figure 2:
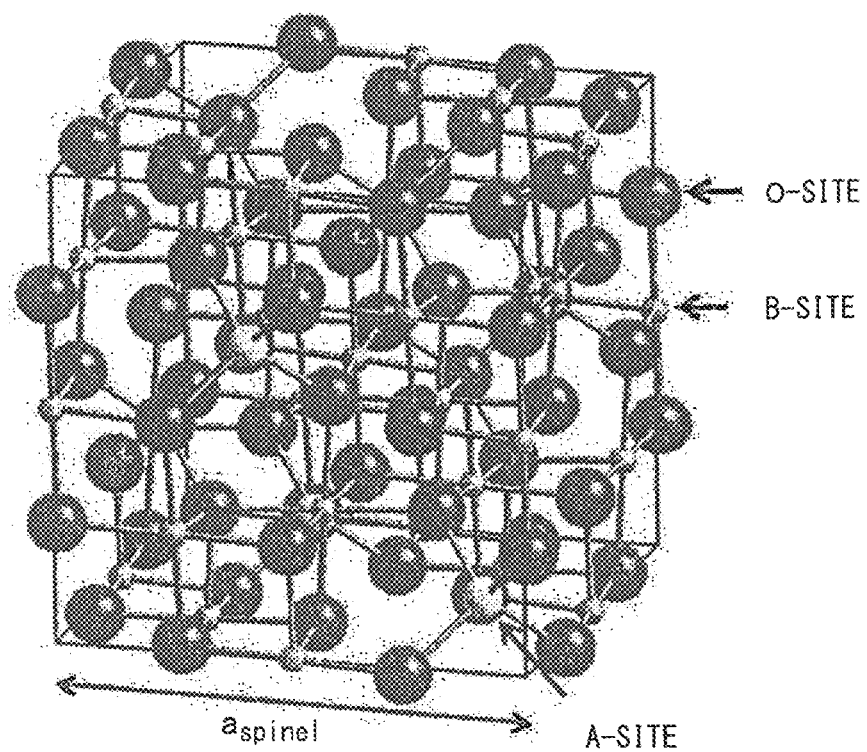
FIG. 2 is a diagram of a crystal structure of a spinel.
Figure 3:
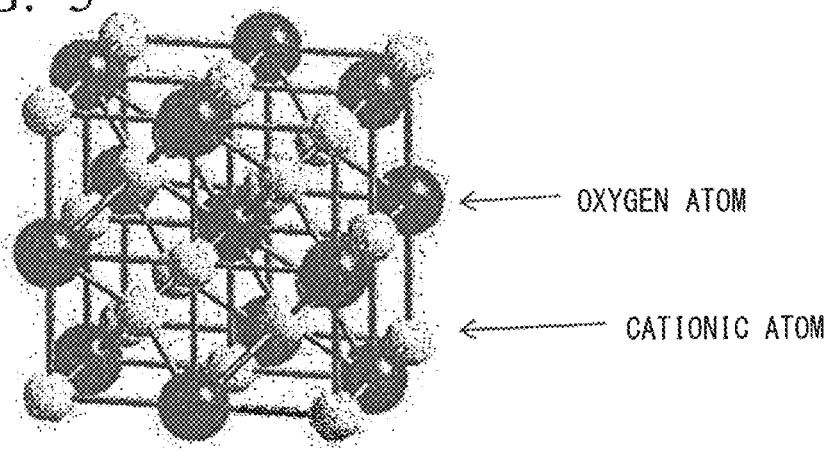
FIG. 3 is a schematic diagram of an ordered spinel structure and a disordered spinel structure with symmetry of Fm-3m having a lattice constant assumed in a tunnel barrier layer of the invention.
Figure 4:
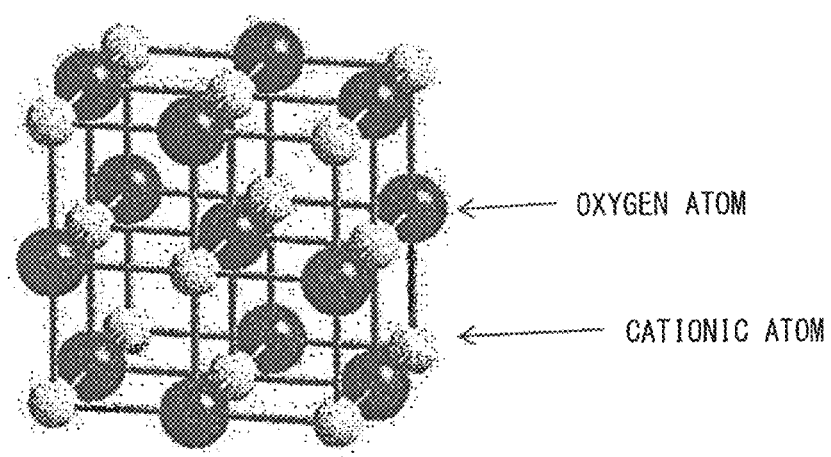
FIG. 4 is a schematic diagram of an ordered spinel structure and a disordered spinel structure with symmetry of Fm-3m having a lattice constant assumed in a tunnel barrier layer of the invention.
Figure 5:
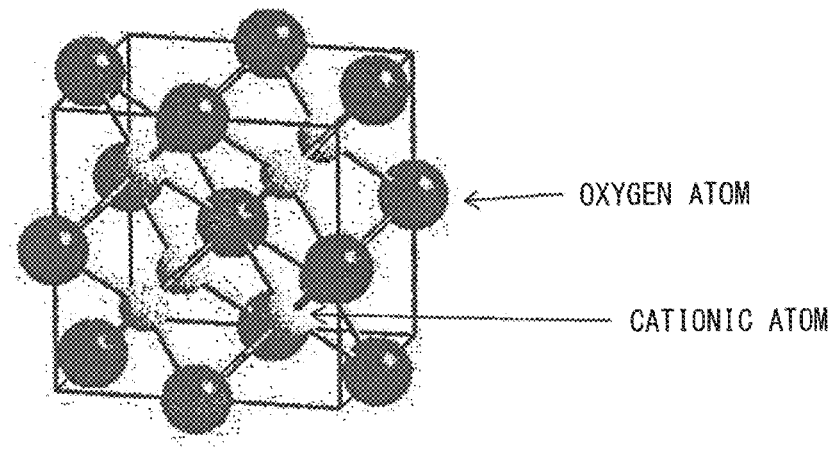
FIG. 5 is a schematic diagram of an ordered spinel structure and a disordered spinel structure with symmetry of Fm-3m having a lattice constant assumed in a tunnel barrier layer of the invention.
Figure 6:
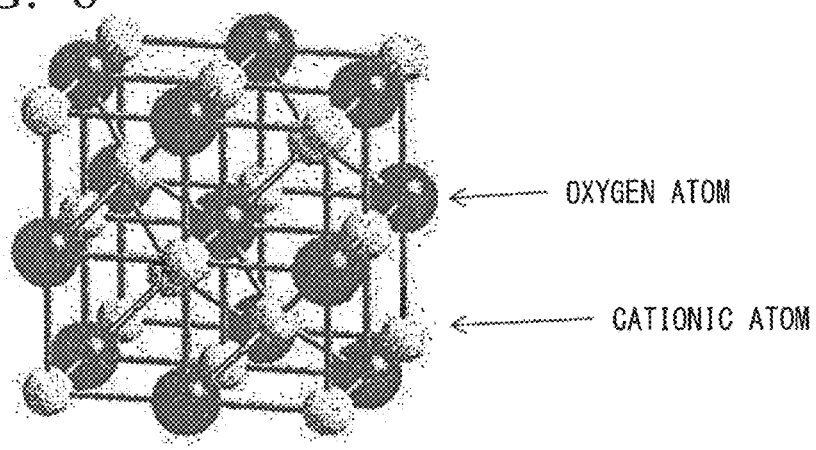
FIG. 6 is a schematic diagram of an ordered spinel structure and a disordered spinel structure with symmetry of F-43m having a lattice constant assumed in a tunnel barrier layer of the invention.
Figure 7:
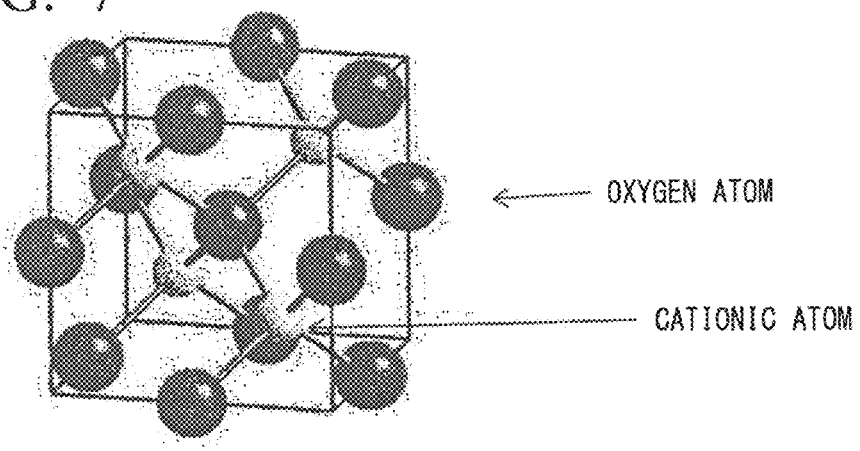
FIG. 7 is a schematic diagram of an ordered spinel structure and a disordered spinel structure with symmetry of F-43m having a lattice constant assumed in a tunnel barrier layer of the invention.

FIG. 2 shows a structure of a spinel. An A-site in which oxygen is fourfold coordinated to cations and a B-site in which oxygen is sixfold coordinated to cations exist. Here, a Sukenel structure referring to the spinel structure in which cations are disordered is a structure that has a lattice constant half the lattice constant of an ordered spinel structure while a position of an oxygen atom of the ordered spinel is almost not changed, and in which cations are positioned in tetrahedral positions and octahedral positions of oxygen atoms that are not occupied under ordinary circumstances. At this time, this structure may include total five structures shown in FIGS. 3 to 7, and may be any one of them or a mixed structure thereof.

(Definition of Disordered Spinel Structure)

In this specification, the spinel structure in which cations are disordered may be referred to as a Sukenel structure. The Sukenel structure refers to a structure where oxygen atoms are arranged in cubic close-packed lattice that is substantially similar to spinel lattice, the structure as a whole belongs to a cubic structure, but arrangement of cations are disordered. In an original ordered spinel, Mg and Al are arranged in order in the tetrahedral vacancies and octahedral vacancies in the original spinel. However, since these are arranged in random arrangement in the Sukenel structure, the crystal symmetry of the structure is different from $MgAl_2O_4$, and the lattice constant of the structure is substantially half of that of $MgAl_2O_4$. With a change in the lattice-repeating unit, a combination between the ferromagnetic layer material and the electronic structure (band structure) is changed, and thus a large TMR enhancement due to a coherent tunneling effect is obtained. For example, a space group of $MgAl_2O_4$ that is a non-magnetic spinel material is Fd-3m, but a space group of a disordered spinel structure with a lattice constant reduced by half is known to be changed to Fm-3m or F-43m, and there are total five structures (Non-Patent Document 2). Any one of them can be used.

In this specification, the Sukenel structure is not essentially required to be a cubic structure. In the stacked structure, the crystal structure is influenced by the crystal structure of the material of an underlayer, and the lattice is thus partially distorted. Each material has a bulk crystal structure, but in a case where it is formed into a thin film, a partially distorted crystal structure based on the bulk crystal structure can be taken. Particularly, in the invention, the tunnel barrier layer has a very thin structure, and is easily influenced by the crystal structure of the layer brought into contact with the tunnel barrier layer. In this regard, the bulk crystal structure of a Sukenel structure is a cubic structure, and in this specification, the Sukenel structure includes a Sukenel structure which does not have a cubic structure in addition to a Sukenel structure slightly deviating from the cubic structure. A deviation from the cubic structure in the Sukenel structure described in this specification is generally slight, and this deviation depends on the accuracy of a measurement method for evaluating the structure.

The divalent cation (A-site) in the non-magnetic element of the tunnel barrier layer is one or more selected from the group consisting of magnesium, zinc, and cadmium. These non-magnetic elements are stable in a case where the concentration of valence is 2, and in a case where these non-magnetic elements are constituent elements of the tunnel barrier layer, coherent tunneling can be realized, and the MR ratio is increased.

In a case where the divalent cation (A-site) contained in the tunnel barrier layer includes plural non-magnetic elements, a difference in ionic radius between the cations of the plural non-magnetic elements is preferably 0.2 A or less. In a case where the difference in ionic radius is small, the cations are unlikely to be ordered, and thus the lattice constant becomes smaller than that of a general spinel structure. Accordingly, the MR ratio is further increased in a case of two or more types of elements that are similar to each other in ionic radius.

The trivalent cation in the non-magnetic elements of the tunnel barrier layer is indium. By using indium, it is possible to narrow a gap with a valence band and to realize the lower RA.

The tunnel barrier layer may have a spinel structure in which an atomic arrangement is disordered. The coherent tunneling effect is increased due to an electronic band folding effect by providing the spinel structure in which the atom arrangement is disordered. Accordingly, the MR ratio is increased.

(First Ferromagnetic Metal Layer)

Examples of the material of the first ferromagnetic metal layer 6 include metal selected from the group consisting of Cr, Mn, Co, Fe, and Ni, alloy including one or more of the metals of the group, and alloy including one or more metals selected from the group and at least one element of B, C, and N. Specific examples thereof include Co—Fe and Co—Fe—B. A Heusler alloy such as $Co_2FeSi$ is preferable in order to obtain a high output. The Heusler alloy includes intermetallic compounds having a chemical composition of $X_2YZ$. X denotes a Co, Fe, Ni, or Cu group transition metal element or noble metal in the periodic table, Y denotes a Mn, V, Cr, or Ti group transition metal, and can also take the elemental species of X, and Z denotes representative elements of III to V groups. Examples thereof include $Co_2FeSi$, $Co_2MnSi$, and $Co_2Mn_{1-a}Fe_aAl_bSi_{1-b}$. In addition, an antiferromagnetic material such as IrMn and PtMn may be used as a material brought into contact with the first ferromagnetic metal layer 6 in order to make coercivity of the first ferromagnetic metal layer larger than that of the second ferromagnetic metal layer 7. Furthermore, the first ferromagnetic metal layer may have a synthetic ferromagnetic coupling structure such that the second ferromagnetic metal layer 7 is not influenced by a leakage magnetic field of the first ferromagnetic metal layer 6.

In a case where a magnetization direction of the first ferromagnetic metal layer 6 is made perpendicular to the stacked plane, a stacked film of Co and Pt is preferably used. For example, in a case where the first ferromagnetic metal layer 6 has a composition of [Co (0.24 nm)/Pt (0.16 nm)]$_6$/Ru (0.9 nm)/[Pt (0.16 nm)/Co (0.16 nm)]$_4$/Ta (0.2 nm)/FeB (1.0 nm), the magnetization direction can be made perpendicular to the stacked plane.

(Second Ferromagnetic Metal Layer)

A ferromagnetic material, particularly, a soft magnetic material is applied as a material of the second ferromagnetic metal layer 7, and examples thereof include metal selected from the group consisting of Cr, Mn, Co, Fe, and Ni, alloy including one or more of the metals of the group, and alloy including one or more metals selected from the group and at least one element of B, C, and N. Specific examples thereof include Co—Fe, Co—Fe—B, and Ni—Fe.

In a case where a magnetization direction of the second ferromagnetic metal layer 7 is made perpendicular to the stacked plane, the second ferromagnetic metal layer 7 preferably has a thickness of 2.5 nm or less. Perpendicular magnetic anisotropy can be applied to the second ferromagnetic metal layer 7 at an interface between the second ferromagnetic metal layer 7 and the tunnel barrier layer 3. The second ferromagnetic metal layer 7 preferably has a thin film thickness since the effect of the perpendicular magnetic anisotropy is reduced if the second ferromagnetic metal layer 7 has a thick film thickness.

In general, the first ferromagnetic metal layer 6 has a structure in which the magnetization direction thereof is fixed, and is called a fixed layer. In addition, since the second ferromagnetic metal layer 7 has a magnetization direction that can be more easily changed by an external magnetic field or a spin torque than the first ferromagnetic metal layer 6, the second ferromagnetic metal layer is called a free layer.

(Substrate)

A magnetoresistance effect element according to the invention may be formed on a substrate.

In that case, a material showing excellent flatness is preferably used as a material of the substrate 1. The substrate 1 differs depending on the purpose. For example, in a case of MRAM, a circuit formed in a Si substrate can be used under the magnetoresistance effect element. In a case of a magnetic head, an AlTiC substrate that can be easily processed can be used.

(Underlayer)

In a case where a magnetoresistance effect element according to the invention is formed on a substrate, first, an underlayer may be formed on the substrate.

In that case, the underlayer 2 is used to control crystallinity such as crystal orientation and crystal grain size of the first ferromagnetic metal layer 6 and layers formed above the first ferromagnetic metal layer 6. Therefore, it is important to select the material of the underlayer 2. Hereinafter, the material and the configuration of the underlayer 2 will be described. Any of a conductive material and an insulating material may be used for the underlayer, but in a case where electric power is fed to the underlayer, a conductive material is preferably used. First, as a first example of the underlayer 2, a nitride layer having a (001)-oriented NaCl structure and containing at least one element selected from the group consisting of Ti, Zr, Nb, V, Hf, Ta, Mo, W, B, Al, and Ce is exemplified. As a second example of the underlayer 2, a (002)-oriented perovskite conductive oxide layer made of RTO$_3$ is exemplified. Here, the R-site includes at least one element selected from the group consisting of Sr, Ce, Dy, La, K, Ca, Na, Pb, and Ba, and the T-site includes at least one element selected from the group consisting of Ti, V, Cr, Mn, Fe, Co, Ni, Ga, Nb, Mo, Ru, Jr, Ta, Ce, and Pb. As a third example of the underlayer 2, an oxide layer having a (001)-oriented NaCl structure and containing at least one element selected from the group consisting of Mg, Al, and Ce is exemplified. As a fourth example of the underlayer 2, a layer having a (001)-oriented tetragonal or cubic structure and containing at least one element selected from the group consisting of Al, Cr, Fe, Co, Rh, Pd, Ag, Ir, Pt, Au, Mo, and W is exemplified. As a fifth example of the underlayer 2, a layer having a stacked structure with a combination of two or more of the layers of the above first to fourth examples is exemplified. By devising the structure of the underlayer as described above, it is possible to control the crystallinity of the ferromagnetic layer 2 and layers formed above the ferromagnetic layer 2, thereby improving the magnetic characteristics.

(Cap Layer)

A cap layer may be formed on the second ferromagnetic metal layer of the magnetoresistance effect element according to the invention.

A cap layer 4 is installed above the second ferromagnetic metal layer 7 in a stacking direction in order to control crystallinity such as crystal orientation and crystal grain size and element diffusion. In a case where a free layer having a bcc structure is formed, the crystal structure of the cap layer may be any one of a fcc structure, a hcp structure, and a bcc structure. In a case where a free layer having a fcc structure is formed, the crystal structure of the cap layer may be any one of a fcc structure, a hcp structure, and a bcc structure. The film thickness of the cap layer may be within such a range that a distortion relaxation effect is obtained and a reduction in the MR ratio by shunt is not shown. The film thickness of the cap layer is preferably 1 nm to 30 nm.

(Shape and Dimensions of Element)

A laminate formed of the first ferromagnetic metal layer, the tunnel barrier layer, and the second ferromagnetic metal layer 2 constituting the invention has a columnar shape. In addition, it may have various shapes such as a circular shape, a square shape, a triangle shape, and a polygonal shape when viewed from top, and preferably has a circular shape from the viewpoint of symmetry. That is, the laminate preferably has a columnar shape.

Figure 8:
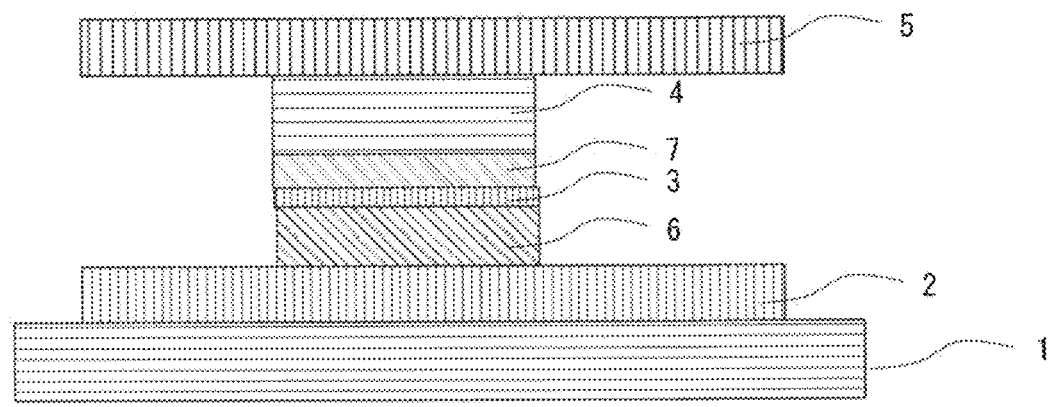
FIG. 8 is a diagram showing a structure to be evaluated of a magnetoresistance effect element according to an embodiment when seen from a direction perpendicular to a stacking direction.
Figure 8:
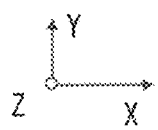
Figure 9:
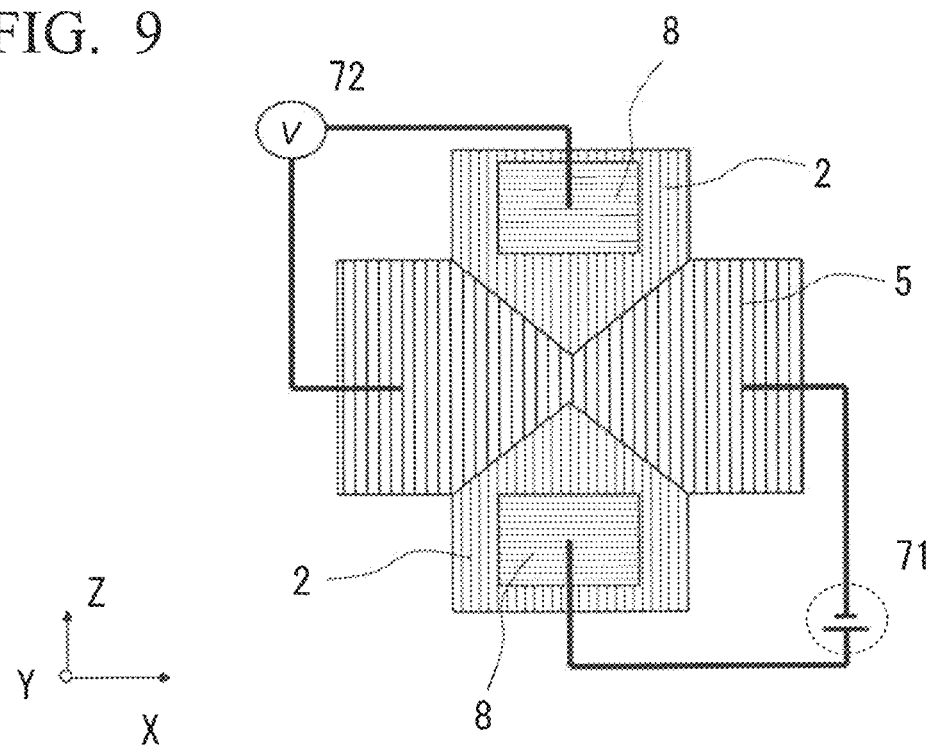
FIG. 9 is a diagram showing the element structure according to the embodiment when seen from the stacking direction.

FIGS. 8 and 9 show examples of the shape and the dimensions of the magnetoresistance effect element.

FIG. 8 is a diagram showing a structure when viewed from a side in a stacking direction of the magnetoresistance effect element 100. The magnetoresistance effect element 100 of FIG. 8 has an electrode layer 5 formed above the cap layer 4 shown in FIG. 1. FIG. 9 is a diagram showing a structure when viewed in the stacking direction of the magnetoresistance effect element 100. In FIG. 9, a current source 71 and a voltmeter 72 are also shown.

The magnetoresistance effect element 100 is processed into a columnar shape of 80 nm or less as shown in FIGS. 8 and 9, and wiring is applied. Since the magnetoresistance effect element 100 is processed into a columnar shape having a size of 80 nm or less, a domain structure is not likely to be formed in the ferromagnetic metal layers, and it is not necessary to consider a component having a different spin polarization in the ferromagnetic metal layers. In FIG. 9, the magnetoresistance effect element 100 is disposed at a position where the underlayer 2 and the electrode layer 5 intersect each other.

(Evaluation Method)

The magnetoresistance effect element 100 can be evaluated with the structure shown in FIGS. 8 and 9. For example, the power supply 71 and the voltmeter 72 are disposed as shown in FIG. 9 such that a fixed current or a fixed voltage is applied to the magnetoresistance effect element 100. By measuring the voltage or the current while sweeping an external magnetic field, a change in the resistance of the magnetoresistance effect element 100 can be measured.

In general, the MR ratio is expressed by the following formula.

$$\text{MR Ratio } (\%) = \{(R_{AP} - R_P)/R_P\} \times 100$$

$R_P$ denotes a resistance in a case where magnetization directions of the first ferromagnetic metal layer 6 and the second ferromagnetic metal 7 are parallel to each other, and $R_{AP}$ denotes a resistance in a case where magnetization directions of the first ferromagnetic metal layer 6 and the second ferromagnetic metal 7 are antiparallel to each other.

In a case where a strong current flows in the magnetoresistance effect element 100, magnetization rotation occurs by a STT effect, and a resistance value of the magnetoresistance effect element 100 is rapidly changed. The current value at which the resistance value is rapidly changed is called an inversion current value (Jc).

(Others)

In this embodiment, the structure has been exemplified in which the first ferromagnetic metal layer 6 having high coercivity is disposed on the lower side, but the invention is not limited to this structure. In a case of a structure in which the first ferromagnetic metal layer 6 having high coercivity is disposed on the upper side, the coercivity is reduced in comparison with a case in which the first ferromagnetic metal layer 6 is disposed on the lower side, but the tunnel barrier layer 3 can be formed by utilizing the crystallinity of the substrate, and thus the MR ratio can be increased.

In order to utilize the magnetoresistance effect element as a magnetic sensor, a resistance change preferably changes linearly with respect to an external magnetic field. In a general laminated film of ferromagnetic layers, magnetization directions are easily directed into the stacked plane by shape anisotropy. In this case, for example, a magnetic field is applied from outside to make the magnetization directions of the first ferromagnetic metal layer and the second ferromagnetic metal layer intersect each other, thereby changing the resistance change linearly with respect to the external magnetic field. However, in this case, since a mechanism that applies a magnetic field is required near the magnetoresistance effect element, this is not preferable for integration. In a case where the ferromagnetic metal layer itself has perpendicular magnetic anisotropy, this is advantageous for integration since a method such as application of a magnetic field from outside is not required.

The magnetoresistance effect element using this embodiment can be used as a magnetic sensor or a memory such as a MRAM. Particularly, this embodiment is effective for products that are used with a bias voltage higher than a bias voltage used in conventional magnetic sensors.

(Manufacturing Method)

The magnetoresistance effect element 100 can be formed using, for example, a magnetron sputtering apparatus.

The tunnel barrier layer 3 can be produced through a known method. For example, a thin metal film is formed on the first ferromagnetic metal layer 6 by sputtering, performing plasma oxidation or natural oxidation by oxygen introduction thereon, and performing a heat treatment thereon. As the film-forming method, not only a magnetron sputtering method but also a thin film-forming method such as a vapor deposition method, a laser ablation method, or a MBE method can be used.

Each of the underlayer, the first ferromagnetic metal layer, the second ferromagnetic metal layer, and the cap layer can be formed through a known method.

Second Embodiment

A second embodiment is different from the first embodiment only in the method of forming a tunnel barrier layer. In the first embodiment, the tunnel barrier layer is formed by repeatedly performing formation and oxidation of a metal film. In the second embodiment, the substrate temperature is lowered to −70 to −30 degrees, and then oxidation is performed in the oxidation step. By cooling the substrate, a temperature gradient is generated between the substrate and the vacuum or between the substrate and the plasma. First, in a case where a surface of the substrate is exposed to oxygen, oxygen reacts with the metal material and the metal material is oxidized. However, the oxidation does not proceed due to the low temperature. Accordingly, the oxygen amount of the tunnel barrier layer is easily adjusted. Moreover, by forming the temperature gradient, epitaxial growth (lattice-matched growth) is easily adjusted. Since the crystal growth proceeds by the temperature gradient, the epitaxial growth is easily performed in a case where the temperature of the substrate is sufficiently lowered. As the temperature of the substrate is increased, domains are formed and a plurality of crystal nuclei are thus formed in the plane. Each of the crystal nuclei is independently and epitaxially grown, and thus a part in which lattices are not matched is formed in a part in which the grown domains are in contact with each other.

It is preferable that in the tunnel barrier layer, lattice-matched parts, which are lattice-matched with both of a first ferromagnetic metal layer and a second ferromagnetic metal layer, partially exist. In general, it is preferable that the tunnel barrier layer be completely lattice-matched to both of the first ferromagnetic metal layer and the second ferromagnetic metal layer. However, in a case where the tunnel barrier layer is completely lattice-matched, spin-polarized electrons interfere with each other during passing through the tunnel barrier layer, and thus the electrons do not easily pass through the tunnel barrier layer. In contrast, in a case where lattice-matched parts, in which lattices are matched, partially exist, the interference between spin-polarized electrons during passing through the tunnel barrier layer is appropriately cut in parts in which lattices are not matched, and thus the spin-polarized electrons easily pass through the tunnel barrier layer. The volume ratio of the lattice-matched part portion in the tunnel barrier layer with respect to the volume of the entire tunnel barrier layer is preferably 65% to 95%. In a case where the volume ratio of the lattice-matched part in the tunnel barrier layer is 65% or less, the effect of coherent tunneling is reduced, and thus the MR ratio decreases. In a case where the volume ratio of the lattice-matched part in the tunnel barrier layer is 95% or greater, the interference effect between the spin-polarized electrons during passing through the tunnel barrier layer is not be weakened, and thus an increase in passage of the spin-polarized electrons through the tunnel barrier layer is not observed.

(Method of Calculating Volume Ratio of Lattice-Matched Portion)

The volume ratio of the lattice-matched part (lattice-matched portion) with respect to the volume of the entire tunnel barrier layer can be estimated from, for example, a TEM image. Regarding whether the lattices are matched, a part including the tunnel barrier layer, the first ferromagnetic metal layer, and the second ferromagnetic metal layer in a cross-section TEM image is Fourier-transformed to obtain an electron beam diffraction image. In the electron beam diffraction image obtained by Fourier transformation, electron beam diffraction spots in directions other than the stacking direction are removed. That image is subjected to inverse Fourier transformation to provide an image in which information only in the stacking direction is obtained. In lattice lines in the inverse Fourier image, a part in which the tunnel barrier layer is continuously connected to both of the first ferromagnetic metal layer and the second ferromagnetic metal layer is defined as a lattice-matched portion. In addition, in lattice lines, a part in which the tunnel barrier layer is not continuously connected to at least one of the first ferromagnetic metal layer and the second ferromagnetic metal layer, or in which no lattice lines are detected, is defined as a lattice-mismatched portion. In the lattice-matched portion, in the lattice lines in the inverse Fourier image, the layers are continuously connected from the first ferromagnetic metal layer to the second ferromagnetic metal layer via the tunnel barrier layer, and thus a width ($L_C$) of the lattice-matched portion can be measured from the TEM image. Similarly, in the lattice-mismatched portion, in the lattice lines in the inverse Fourier image, the layers are not continuously connected, and thus a width ($L_I$) of the lattice-mismatched portion can be measured from the TEM image. Using the width ($L_C$) of the lattice-matched portion as a numerator and using the sum of the width ($L_C$) of the lattice-matched portion and the width ($L_I$) of the lattice-mismatched portion as a denominator, the volume ratio of the lattice-matched portion with respect to the volume of the entire tunnel barrier layer can be obtained. The TEM image is a cross-section image, but includes information including a depth. Accordingly, it can be thought that the region estimated from the TEM image is proportional to the volume.

Figure 14:
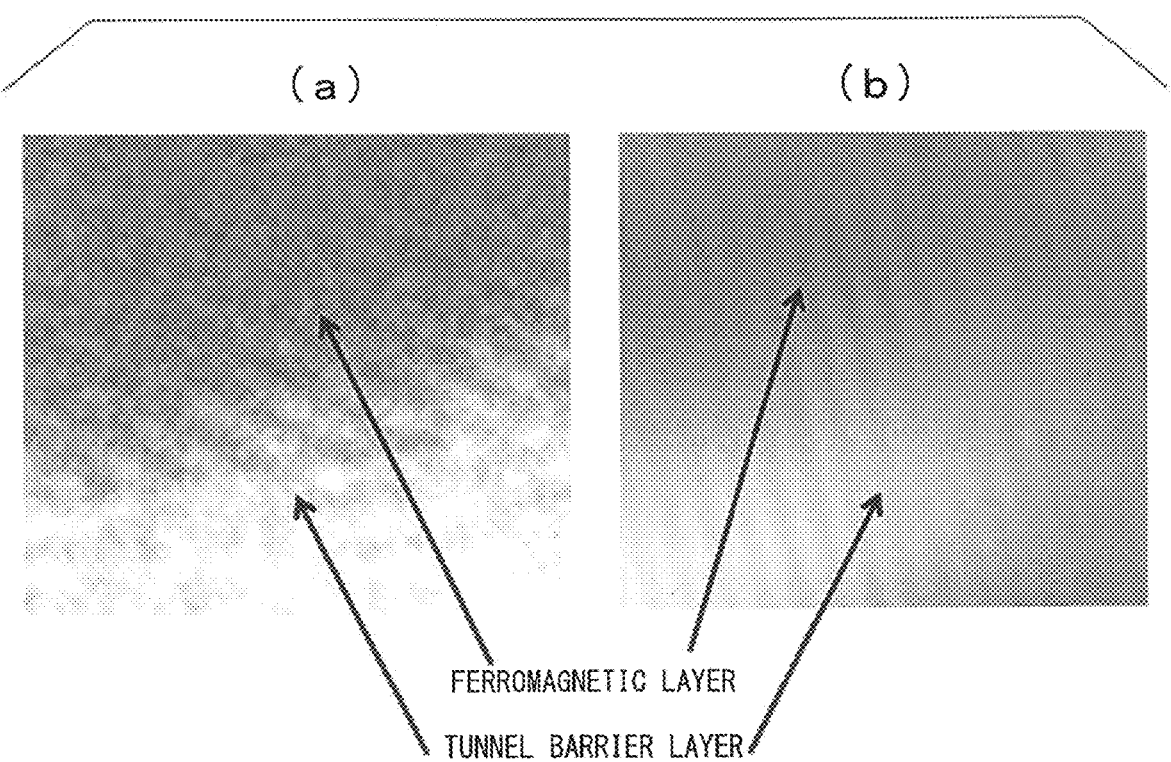
FIGS. 14(A) and 14(B) show examples of a part in which the tunnel barrier layer and the ferromagnetic metal layer are lattice-matched.

FIGS. 14(A) and 14(B) show examples of the part in which the tunnel barrier layer and the ferromagnetic metal layer are lattice-matched. FIG. 14(A) shows an example of a high-resolution cross-section TEM image. FIG. 14(B) shows an example of an image obtained by performing inverse Fourier transformation after removal of electron beam diffraction spots in directions other than the stacking direction in the electron beam diffraction image. In FIG. 14(B), components perpendicular to the stacking direction are removed, and thus lattice lines can be observed in the stacking direction. This shows that the tunnel barrier layer and the ferromagnetic metal layer are continuously connected to each other without interruption at an interface therebetween.

EXAMPLES

Example 1

Hereinafter, an example of the method of manufacturing a magnetoresistance effect element according to the first embodiment will be described. Film formation was performed on a substrate provided with a thermal silicon oxide film using a magnetron sputtering method. As an underlayer, 5 nm of Ta/3 nm of Ru was formed, and as a first ferromagnetic metal layer, 12 nm of IrMn/10 nm of CoFe/0.8 nm of Ru/7 nm of CoFe was formed in this order on the underlayer. Next, a method of forming a tunnel barrier layer will be shown. A 0.4 nm thick film of $MgIn_2$ is formed by sputtering with a target having an alloy composition of $MgIn_2$. Thereafter, the above-described sample was moved to an oxidation chamber of which the inside was kept in an ultrahigh vacuum of $1\times10^{-8}$ Pa or less to perform natural oxidation by introducing Ar, oxygen. The natural oxidation was 10 seconds at a partial pressure ratio of 1:25 (Ar: oxygen) and a total gas pressure of 0.05 Pa. Then, the sample was returned to a film-forming chamber, and a film of $MgIn_2$ with a thickness of 0.4 nm was formed. The above-described sample was moved to the oxidation chamber of which the inside was kept in an ultrahigh vacuum of $1\times10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

The above-described stacked film was moved again to the film-forming chamber, and a 5 nm CoFe film was formed as a second ferromagnetic metal layer 7. 3 nm of Ru/5 nm of Ta was formed as a cap layer 4.

The above-described stacked film was installed in an annealing apparatus, and was heated at a temperature of 350° C. in an Ar atmosphere for 10 minutes. Thereafter, under an applied field of 8 kOe, a heat treatment was performed on the stacked film at 280 degrees for 6 hours.

Next, an element was formed as in FIG. 9. First, a photoresist was formed using electron beam lithography in such a way that the electrode layer was in a direction rotated by 90 degrees as in FIG. 9. A part other than a part below the photoresist was eliminated by an ion milling method to expose the thermal silicon oxide film that was the substrate, and thus a shape of the underlayer 2 was formed. In a narrow part in the shape of the underlayer, a photoresist was formed into a cylindrical shape of 80 nm using electron beam lithography, and a part other than a part below the photoresist was eliminated by an ion milling method to expose the underlayer. Thereafter, SiOx was formed as an insulating layer on the part shaved by ion milling. Here, the photoresist with a cylindrical shape of 80 nm was removed. The photoresist was not formed only in a part corresponding to an electrode pad of FIG. 9, and the insulating layer was removed by an ion milling method to expose the underlayer. Thereafter, an Au layer was formed. This electrode pad 8 functions as a contact electrode for the underlayer of the above-described stacked film. Next, a photoresist was formed and shaping was performed by an ion milling method such that the electrode layer of FIG. 9 was formed, and an Au film was formed. This functions as a contact electrode for the electrode layer of the above-described stacked film.

Characteristic Evaluation of Example 1

Figure 10:
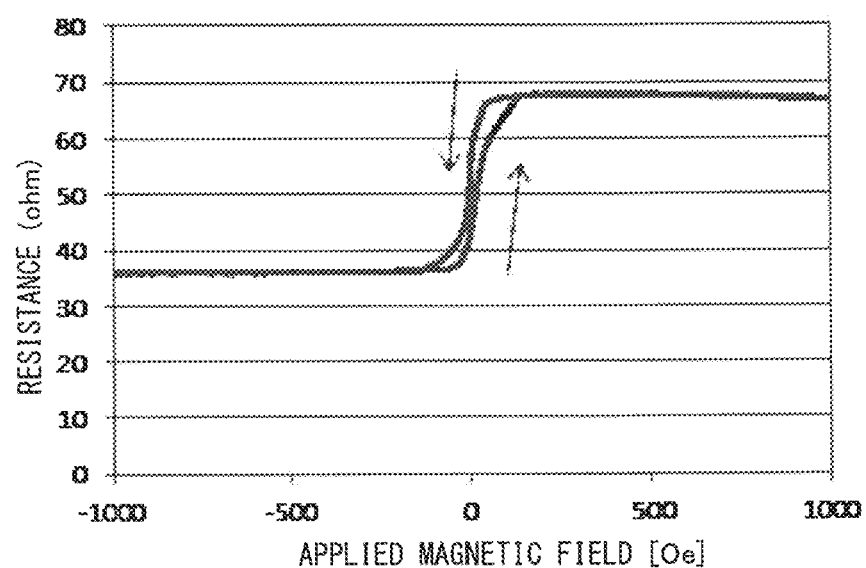
FIG. 10 is a graph showing results of evaluation of a magnetoresistance effect of a magnetoresistance effect element of Example 1.

The magnetoresistance effect element evaluation method is based on a magnetoresistance effect element evaluation method that has been generally performed. As shown in FIG. 9, a current source and a voltmeter were connected to the electrode pad and the electrode layer, respectively, to perform measurement by a four-terminal method. 100 mV of a bias voltage was applied from the voltmeter, and a current was measured by the current source to obtain a resistance value. The changing resistance value was observed by applying a magnetic field to the magnetoresistance effect element from outside. FIG. 10 is a diagram showing results of the evaluation of the magnetoresistance effect of the magnetoresistance effect element of Example 1. The horizontal axis represents a magnetic field, and the vertical axis represents the resistance of the element. The bias voltage applied was 0.1V, and electrons flowed in a direction from the first ferromagnetic metal layer to the second ferromagnetic layer 7. From FIG. 10, it was found that the MR ratio was 60%, and the area resistance (RA) of the element was $0.18\Omega\cdot\mu m^2$.

Structure Analysis of Example 1

Structure analysis of the tunnel barrier layer was evaluated with an electron diffraction image obtained using a transmission electron beam. The structure of the barrier layer was examined through this method, and it was confirmed that there was reflection from the 10221 plane and the 11111 plane shown in the ordered spinel structure. In addition, it was found that this tunnel barrier layer was a spinel structure consisting of a cubic structure.

Example 2

The production method is similar to that in the Example, but only the material for forming the tunnel barrier layer is different. A 0.4 nm thick film of $ZnIn_2$ is formed by sputtering with a target having an alloy composition of $ZnIn_2$. Thereafter, the above-described sample was moved to an oxidation chamber of which the inside was kept in an ultrahigh vacuum of $1\times10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film forming chamber, and a film of $ZnIn_2$ with a thickness of 0.4 nm was formed. The above-described sample was moved to the oxidation chamber of which the inside was kept in an ultrahigh vacuum of $1\times10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

Characteristics of Example 2

As a result of the measurement of the magnetoresistance effect, it was found that in a case where the bias voltage was 0.1 V the MR ratio was 54.8%, and the area resistance (RA) of the element was $0.16\Omega\cdot\mu m^2$. Furthermore, this barrier was confirmed as a spinel structure consisting of a cubic structure from an electron beam diffraction image.

Example 3

The production method is similar to that in the Example 1, but only the material for forming the tunnel barrier layer is different. A target having an alloy composition of $CdIn_2$ was subjected to sputtering to form a film of $CdIn_2$ with a thickness of 0.4 nm. Thereafter, the above-described sample was moved to an oxidation chamber of which the inside was kept in an ultrahigh vacuum of $1\times10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film forming chamber, and a film of CdIn$_2$ with a thickness of 0.4 nm was formed. The above-described sample was moved to the oxidation chamber of which the inside was kept in an ultrahigh vacuum of 1×10$^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

Characteristics of Example 3

As a result of the measurement of the magnetoresistance effect, it was found that in a case where the bias voltage was 0.1 V, the MR ratio was 40%, and the area resistance (RA) of the element was 0.122Ω·μm$^2$. Furthermore, this tunnel barrier layer was confirmed as a spinel structure consisting of a cubic structure from an electron beam diffraction image.

Example 4

The production method is similar to that in the Example 1, but only the material for forming the tunnel barrier layer is different. A target having an alloy composition of Mg and MgIn$_2$ was subjected to sputtering to form a film of X nm of Mg/Y nm of In/Zn m of MgIn$_2$. In this case, X+Y+Z was adjusted to be 0.4. Thereafter, the above-described sample was moved to an oxidation chamber of which the inside was kept in an ultrahigh vacuum of 1×10$^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film forming chamber, and a film of X nm of Mg/Y nm of In/Z nm of MgIn$_2$ was formed. In this case, X+Y+Z was adjusted to be 0.4. The above-described sample was moved to the oxidation chamber of which the inside was kept in an ultrahigh vacuum of 1×10$^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa. By properly adjusting amounts of X and Y, a composition ratio of Mg was in a range of 0.5 to 1.5 when the concentration of In was 2.

Characteristics of Example 4

The relative amounts of Mg and In were compared using an EDS in the elements each of which corresponds to the respective composition ratio. Electron beam diffraction evaluation for the tunnel barrier layer was performed with the EDS in a case where a composition ratio of Mg is 0.5, 1 or 1.5 when the concentration of In was 2. As a result, it was confirmed that this tunnel barrier layer was a spinel structure consisting of a cubic structure in a case where the concentration of Mg is 1 from an electron diffraction image. It was also confirmed that there was no reflection from the {022} plane and the {111} plane shown in the ordered spinel structure in a case where the concentration of Mg is 0.5 or 1.5, thus this tunnel barrier layer had the spinel structure consisting of a disordered cubic structure.

Figure 11:
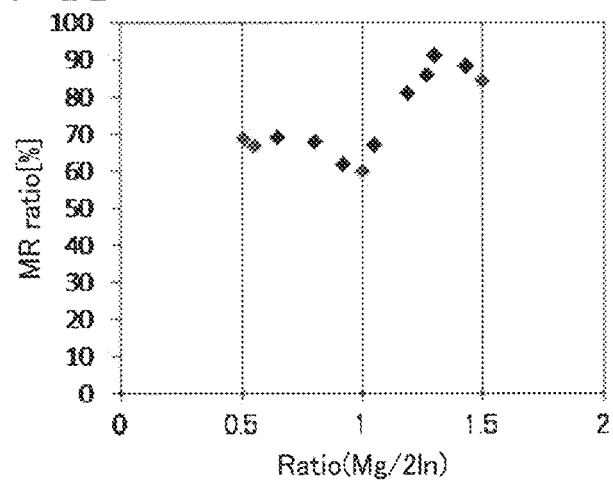
FIG. 11 is a diagram showing a ratio of the concentration of Mg in a case where the concentration of In is 2 in the magnetoresistance effect element of Example 1.

FIG. 11 is a diagram showing a ratio of the concentration of elements of Mg in a case where the concentration of In is 2 in the magnetoresistance effect element of Example 1.

From FIG. 11, it was found that the MR ratio was high in a case where a ratio of concentrations of Mg exceeded 1. That is, it was found that it was preferable the concentration of constituent elements of the divalent cation in a unit cell was more than half the concentration of elements of the trivalent cation in a unit cell. It was found that the tunnel barrier layer with the spinel structure consisting of a disordered cubic structure was able to obtain the high MR ratio from an electron diffraction. Furthermore, it was confirmed that the MR ratio was higher in a case where an amount of Mg exceeded 1.

Example 5

The production method is similar to that in the Example 1, but only the material for forming the tunnel barrier layer is different. A target having an alloy composition of Mg$_{1.3}$In$_2$ was subjected to sputtering using a linear shutter. A film of Mg$_{1.3}$In$_2$ alloy was formed to have a thickness t$_{MgIn}$ of 0.01 to 1.5 nm. Thereafter, the above-described sample was moved to an oxidation chamber of which the inside was kept in an ultrahigh vacuum of 1×10$^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film forming chamber, and a target having an alloy composition of Mg$_{1.3}$In$_2$ was subjected to sputtering using a linear shutter. A film of Mg$_{1.3}$In$_2$ alloy was formed to have a thickness t$_{MgIn}$ of 0.01 to 1.5 nm. The above-described sample was moved to the oxidation chamber of which the inside was kept in an ultrahigh vacuum of 1×10$^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

Characteristics of Example 5

Figure 12:
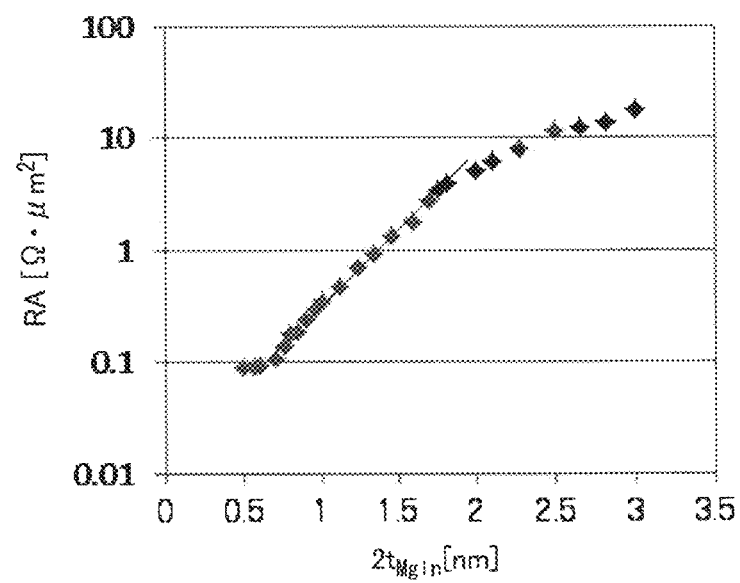
FIG. 12 is a diagram plotting RA and a film thickness ($2t_{MgIn}$) of a tunnel barrier layer in Example 5.
Figure 13:
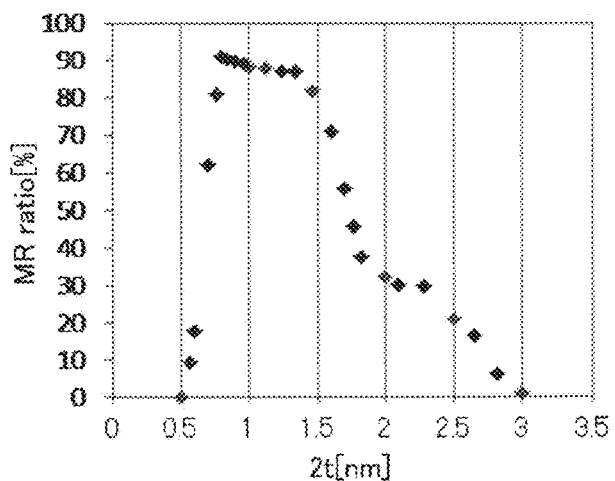
FIG. 13 is a diagram plotting the MR ratio and a film thickness ($2t_{MgIn}$) of a tunnel barrier layer in Example 5.

FIG. 12 is a diagram plotting RA and a thickness (2t$_{MgIn}$) of a tunnel barrier layer in Example 5. From FIG. 12, RA was exponentially increased in a range where 2t$_{MgIn}$ is 0.7 to 1.76 nm. Thus it was understood that the optimal oxidization condition was established in this range of RA. FIG. 13 is a diagram plotting the MR ratio and a thickness (2t$_{MgIn}$) of a tunnel barrier layer in Example 5. Similar to FIG. 12, it was found that the high MR ratio was shown in a range where 2t$_{MgIn}$ was 0.7 to 1.7 nm. That is, it was found that the tunnel barrier layer was able to obtain the high MR ratio in a range where the optimal oxidization condition was established.

Example 6

The production method is similar to that in the Example 1, but only the materials for forming the first ferromagnetic metal layer and the tunnel barrier layer are different. For the first ferromagnetic metal layer, an alloy composition of Co$_2$Mn$_{0.7}$Fe$_{0.3}$Si$_{0.66}$Al$_{0.36}$ was used for forming a film instead of CoFe. 12 nm of IrMn/10 nm of CoFe/0.8 nm of Ru/2 nm of CoFe/5 nm of Co$_2$Mn$_{0.7}$Fe$_{0.3}$Si$_{0.66}$Al$_{0.36}$ was formed as a first ferromagnetic metal layer in order, provided that a substrate was heated at 450° C. only when forming a film of Co$_2$Mn$_{0.7}$Fe$_{0.3}$Si$_{0.66}$Al$_{0.36}$ alloy composition. The substrate was sufficiently subjected to heat radiation before forming a tunnel barrier layer such that the substrate temperature was lowered to a room temperature, and then the subsequent film forming processes were performed. For the tunnel barrier layer, a target having an alloy composition of $Mg_{1.3}In_2$ was subjected to sputtering to form a film of $Mg_{1.3}In_2$ with a thickness of 0.4 nm. Thereafter, the above-described sample was moved to an oxidation chamber of which the inside was kept in an ultrahigh vacuum of $1 \times 10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film forming chamber, and a target having an alloy composition of $Mg_{1.3}In_2$ was subjected to sputtering to from a film of $Mg_{1.3}In_2$ with a thickness of 0.4 nm. The above-described sample was moved to the oxidation chamber of which the inside was kept in an ultrahigh vacuum of $1 \times 10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

Characteristics of Example 6

As a result of the measurement of the magnetoresistance effect, it was found that in a case where the bias voltage was 0.1 V, the MR ratio was 128.5%, and the area resistance (RA) of the element was $0.17\Omega \cdot \mu m^2$.

Example 7

The production method is similar to that in Example 1, but only the method for forming the tunnel barrier layer is different. Film formation was performed on a substrate provided with a thermal silicon oxide film using a magnetron sputtering method. 5 nm of Ta/3 nm of Ru was formed as an underlayer, and 12 nm of IrMn/10 nm of CoFe/0.8 nm of Ru/7 nm of CoFe was formed as a first ferromagnetic metal layer in order. Next, a method of forming a tunnel barrier layer will be shown. A target having an alloy composition of $MgIn_2$ was subjected to sputtering to form a film of $MgIn_2$ with a thickness of 0.4 nm. Thereafter, the above-described sample was moved to an oxidation chamber of which the inside was kept in an ultrahigh vacuum of $1 \times 10^{-8}$ Pa or less, and the substrate was cooled to −70 to −30 degrees. Then, natural oxidation was performed by introducing Ar and oxygen. The natural oxidation time was 10 seconds, the partial pressure ratio of Ar to oxygen was 1 to 25, and the total gas pressure was 0.05 Pa. Then, the sample was returned to a film forming chamber, and a film of $MgIn_2$ with a thickness of 0.4 nm was formed. The above-described sample was moved to the oxidation chamber of which the inside was kept in an ultrahigh vacuum of $1 \times 10^{-8}$ Pa or less, and the substrate was cooled to −70 to −30 degrees. Then, natural oxidation and inductively coupled plasma oxidation were performed by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

Cross-Section Analysis of Example 7

A volume ratio of the lattice-matched part (lattice-matched portion) with respect to the volume of the entire tunnel barrier layer was calculated as described above using a cross-section transmission electron microscope (TEM) image and an image obtained by removing electron beam diffraction spots in a direction other than a stacking direction in an electron beam diffraction image obtained by Fourier-transforming the TEM image and by then performing inverse Fourier transformation.

Figure 15:
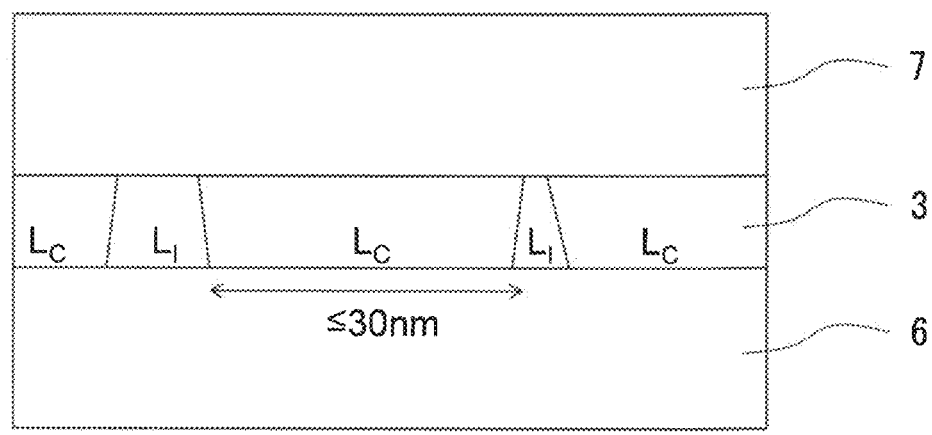
FIG. 15 is a diagram showing a structure of a cross-section including a direction parallel to a stacking direction of Example 7.

FIG. 15 is a structural schematic diagram of a cross-section including a direction parallel to the stacking direction of Example 7. From the high-resolution cross-section TEM image obtained in Example 7, it was found that a size (width) of the film surface of the lattice-matched part of the tunnel barrier layer in a direction parallel thereto was 30 nm or less in any part. 30 nm is about 10 times the lattice constant of the CoFe alloy that is the material of the first ferromagnetic metal layer and the second ferromagnetic metal layer, and mutual interference of the spin-polarized electrons in a direction perpendicular to the tunneling direction before or after coherent tunneling can be thought to be intensified about 10 times the lattice constant.

Figure 16:
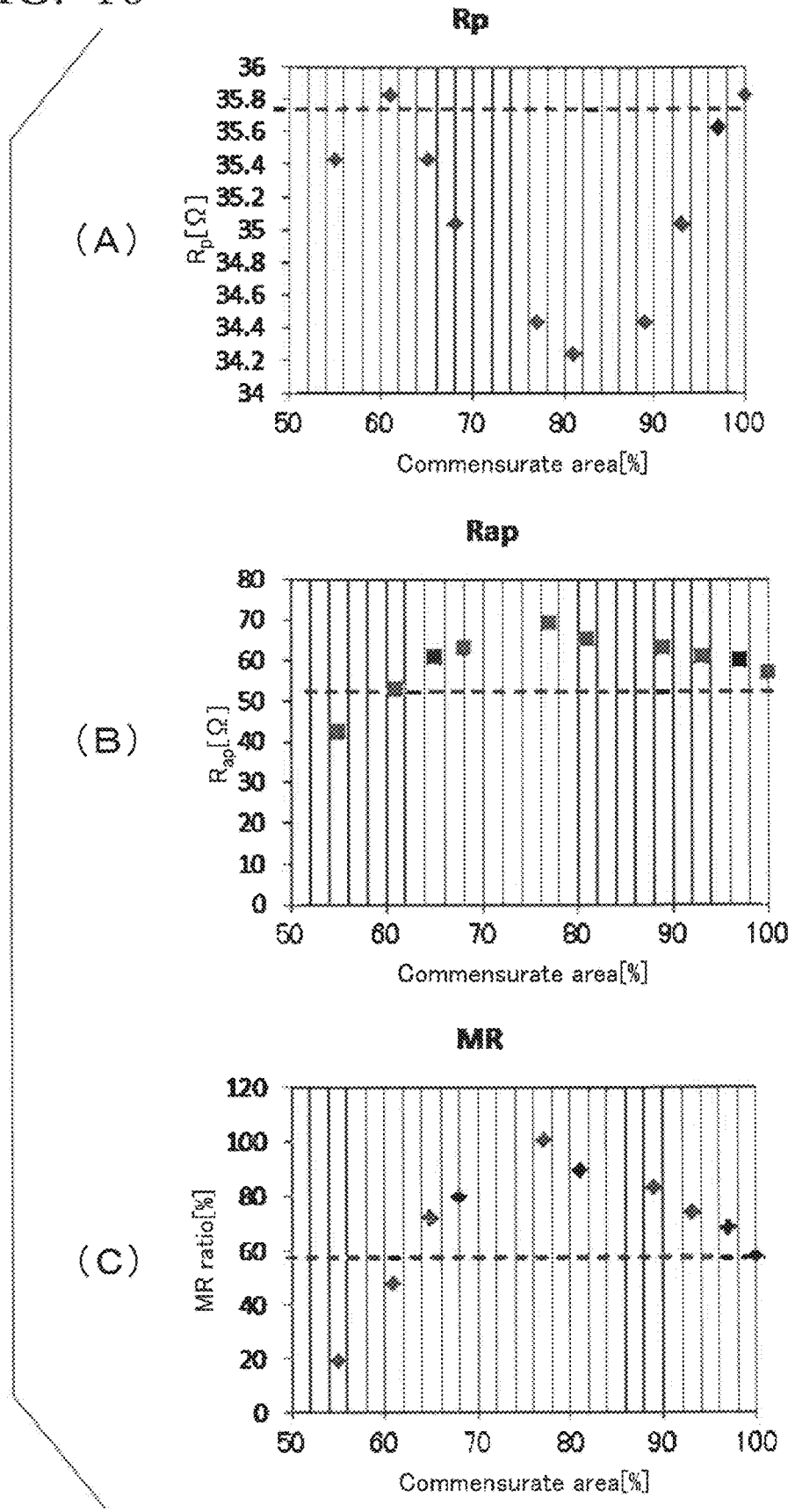
FIGS. 16(A), 16(B) and 16(C) are diagrams showing a proportion of a lattice-matched portion in which a tunnel barrier layer of Example 7 is lattice-matched with both of a first ferromagnetic metal layer and a second ferromagnetic metal layer, and characteristics of an element.

FIGS. 16(A), 16(B) and 16(C) are diagrams showing a volume ratio of the lattice-matched part (lattice-matched portion) with respect to the volume of the entire tunnel barrier layer of Example 7 and characteristics of the element. FIG. 16(A) is a diagram showing element resistance (Rp) when magnetization directions of the first ferromagnetic metal layer and the second ferromagnetic metal layer are parallel to each other. FIG. 16(B) is a diagram showing element resistance (Rap) when magnetization directions of the first ferromagnetic metal layer and the second ferromagnetic metal layer are antiparallel to each other. FIG. 16(C) is a diagram showing a magnetoresistance ratio of the element. The Rp tends to be reduced when the proportion of the lattice-matched part in which the tunnel barrier layer is lattice-matched to both of the first ferromagnetic metal layer and the second ferromagnetic metal layer is in the range of 65% to 95%. Regarding this, in a case where the tunnel barrier layer is completely lattice-matched, spin-polarized electrons interfere with each other during passing through the tunnel barrier layer, and thus it is thought that the electrons do not easily pass through the tunnel barrier layer. In contrast, in a case where the lattice-matched parts, in which lattices are matched, partially exists, the interference of spin-polarized electrons during passing through the tunnel barrier layer is appropriately cut in a part in which lattices are not matched, and thus the spin-polarized electrons easily pass through the tunnel barrier layer. As a result, it is thought that a tendency of a reduction in the Rp is observed. At the same time, a tendency of a slight increase in the Rap is observed when the proportion of the lattice-matched portion is in the range of 65% to 95%. This indicates that even when the magnetization directions of the first ferromagnetic metal layer and the second ferromagnetic metal layer are antiparallel to each other, the interference between domains is eased, and it is found that the spin-polarized electrons passing through the tunnel barrier layer are magnetically scattered.

Comparative Example 1

The production method is similar to that in the Example, but only the material for forming the tunnel barrier layer is different from that of Example 1. A 0.45 nm thick film of Mg is formed by sputtering with a target having an alloy composition of Mg. Thereafter, the above-described sample was moved to an oxidation chamber of which the inside was kept in an ultrahigh vacuum of $1 \times 10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a film of Mg with a thickness of 0.4 nm was formed. The above-described sample was moved to the oxidation chamber of which the inside was kept in an ultrahigh vacuum of $1\times10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa. Furthermore, it was confirmed that the spinel structure was a disordered cubic structure from an electron beam diffraction image.

Characteristics of Comparative Example 1

As a result of the measurement of the magnetoresistance effect, it was found that the MR ratio at a bias voltage of 0.1V was 162.9%, and the area resistance (RA) of the element was $0.594\Omega\cdot\mu m^2$.

Comparative Example 2

The production method is similar to that in the Example 1, but only the material for forming the tunnel barrier layer is different from that of Example 1 A 0.4 nm thick film of $MgAl_2$ is formed by sputtering with a target having an alloy composition of $MgAl_2$. Thereafter, the above-described sample was moved to an oxidation chamber of which the inside was kept in an ultrahigh vacuum of $1\times10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a film of $MgAl_2$ with a thickness of 0.4 nm was formed. The above-described sample was moved to the oxidation chamber of which the inside was kept in an ultrahigh vacuum of $1\times10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa. Furthermore, it was confirmed that the spinel structure was a disordered cubic structure from an electron beam diffraction image.

Characteristics of Comparative Example 2

As a result of the measurement of the magnetoresistance effect, it was found that the MR ratio at a bias voltage of 0.1V was 103.4%, and the area resistance (RA) of the element was $0.8\Omega\cdot\mu m^2$. In addition, it was confirmed the spinel structure based on an electron beam diffraction image.

Comparison of Examples with Comparative Examples

Table 1 shows the examples and the comparative examples.

TABLE 1

|  | RA [$\Omega\cdot\mu m^2$] | MR Ratio [%] |
| --- | --- | --- |
| EXAMPLES |  |  |
| EXAMPLE 1 | 0.18 | 60 |
| EXAMPLE 2 | 0.16 | 54.8 |
| EXAMPLE 3 | 0.122 | 40.2 |
| EXAMPLE 6 | 0.17 | 128.5 |

TABLE 1-continued

|  | RA [$\Omega\cdot\mu m^2$] | MR Ratio [%] |
| --- | --- | --- |
| COMPARATIVE EXAMPLES |  |  |
| COMPARATIVE EXAMPLES 1 | 0.594 | 162.9 |
| COMPARATIVE EXAMPLES 2 | 0.80 | 103.4 |

In a case where the examples are compared with the comparative examples, it is found that the comparative examples have higher MR ratio and RA. Especially, values of RA are about three times higher than those of examples. According to Non Patent Document 1, it is known that the highest reproducing performance can be obtained when RA is about 0.1 to 0.2 in a magnetic sensor for detecting a magnetic field of a micro-region, which is represented by a magnetic head, with a consideration of high-frequency response. That is, the elements of the comparative examples cannot be served as a device. Furthermore, in order to be used as the MRAM, it is necessary to apply a current having sufficient current density at a low voltage to the magnetoresistance effect element. For the elements of examples, the current density is $10^7$ $A/cm^2$ or larger under the condition of the applied voltage of 0.1 V. Thus it is found that the magnetoresistance effect element can be easily switchable by applying the current.

INDUSTRIAL APPLICABILITY

This invention is possible to apply to a magnetoresistance effect element that obtains a high MR ratio with lower RA than in a TMR element using MgO or $MgAl_2O_4$, conventional materials of a tunnel barrier layer.

DESCRIPTION OF THE REFERENCE SYMBOLS

100: MAGNETORESISTANCE EFFECT ELEMENT
1: SUBSTRATE
2: UNDERLAYER
3: TUNNEL BARRIER LAYER
4: CAP LAYER
5: ELECTRODE LAYER
6: FIRST FERROMAGNETIC METAL LAYER
7: SECOND FERROMAGNETIC METAL LAYER
8: ELECTRODE PAD
71: CURRENT SOURCE
72: VOLTMETER

The invention claimed is:
1. A magnetoresistance effect element comprising:
an underlayer;
a first ferromagnetic metal layer;
a second ferromagnetic metal layer; and
a tunnel barrier layer that is sandwiched between the first and second ferromagnetic metal layers,
wherein the tunnel barrier layer has a spinel structure and comprises:
at least one lattice-matched portion that is lattice-matched with both of the first ferromagnetic metal layer and the second ferromagnetic metal layer; and
at least one lattice-mismatched portion that is not lattice-matched with at least one of the first ferromagnetic metal layer and the second ferromagnetic metal layer, and the underlayer is made of
a nitride containing at least one element selected from the group consisting of Ti, Zr, Nb, V, Hf, Ta, Mo, W, B, Al and Ce;
a layer having a stacked structure with a combination of a nitride layer containing at least one element selected from the group consisting of Ti, Zr, Nb, V, Hf, Ta, Mo, W, B, Al and Ce and a layer containing at least one element selected from the group consisting of Al, Cr, Fe, Co, Rh, Pd, Ag, Ir, Pt, Au, Mo, and W.

2. The magnetoresistance effect element according to claim 1,
wherein a volume ratio of the lattice-matched portion with respect to a volume of the entire tunnel barrier layer is 65% to 95%.

3. The magnetoresistance effect element according to claim 1,
wherein the tunnel barrier layer has a spinel structure in which an atomic arrangement is disordered.

4. The magnetoresistance effect element according to claim 1,
wherein the first ferromagnetic metal layer has larger coercivity than that of the second ferromagnetic metal layer.

5. The magnetoresistance effect element according to claim 1,
wherein the tunnel barrier layer has a film thickness of 0.7 nm to 1.7 nm.

6. The magnetoresistance effect element according to claim 1,
wherein at least one of the first ferromagnetic metal layer and the second ferromagnetic metal layer has magnetic anisotropy perpendicular to a stacking direction.

7. The magnetoresistance effect element according to claim 1,
wherein at least one of the first ferromagnetic metal layer and the second ferromagnetic metal layer is $Co_2Mn_{1-a}Fe_aAl_bSi_{1-b}$ ($0 \leq a \leq 1$, $0 \leq b \leq 1$).

8. The magnetoresistance effect element according to claim 1, wherein the underlayer is made of a nitride containing at least one element selected from the group consisting of Ti, Zr, Nb, V, Hf, Ta, Mo, W, B, Al and Ce.

9. The magnetoresistance effect element according to claim 1,
wherein the underlayer is made of a layer having a stacked structure with a combination of a nitride layer containing at least one element selected from the group consisting of Ti, Zr, Nb, V, Hf, Ta, Mo, W, B, Al and Ce and a layer containing at least one element selected from the group consisting of Al, Cr, Fe, Co, Rh, Pd, Ag, Ir, Pt, Au, Mo, and W.

* * * * *